(12) United States Patent
Koudymov et al.

(10) Patent No.: US 7,795,672 B2
(45) Date of Patent: Sep. 14, 2010

(54) PROFILED GATE FIELD EFFECT TRANSISTOR WITH ENHANCED HIGH HARMONIC GAIN

(75) Inventors: Alexei Koudymov, Troy, NY (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 587 days.

(21) Appl. No.: 11/746,088

(22) Filed: May 9, 2007

(65) Prior Publication Data

US 2008/0150019 A1   Jun. 26, 2008

Related U.S. Application Data

(60) Provisional application No. 60/877,175, filed on Dec. 26, 2006, provisional application No. 60/877,177, filed on Dec. 26, 2006.

(51) Int. Cl.
*H01L 29/94* (2006.01)
(52) U.S. Cl. .................. 257/331; 257/401; 438/692
(58) Field of Classification Search ................ 257/331, 257/401; 438/692
See application file for complete search history.

(56) References Cited

U.S. PATENT DOCUMENTS

| 3,573,571 | A | * | 4/1971 | Brown et al. ................. 257/488 |
| 4,263,663 | A | * | 4/1981 | Powell ........................ 365/182 |
| 5,939,941 | A | | 8/1999 | Nair et al. |
| 6,359,513 | B1 | | 3/2002 | Kuo et al. |
| 6,861,907 | B2 | | 3/2005 | Gotou |
| 7,151,407 | B2 | | 12/2006 | Grundlingh |

OTHER PUBLICATIONS

U.S. Appl. No. 11/746,093, Amendment To Office Action, Dec. 19, 2008, 10 pages.
U.S. Appl. No. 11/746,093, Office Action, Sep. 19, 2008, 5 pages.
PCT App No. PCT/US2007/088772 International Search Report and Written Opinion; May 26, 2008; 10 pages.
Gao et al., "Two-Stage Quasi-Class-E Power Amplifier in GaN HEMT Technology," IEEE Microwave and Wireless Components Letters, 2006, pp. 1-3.
Higashiwaki et al., "AlGaN/GaN MIS-HFETs With fT of 163 GHz Using Cat-CVD SiN Gate-Insulating and Passivation Layers," IEEE Electron Device Letters, vol. 27, No. 1, Jan. 2006, pp. 16-18.
Kee et al., "The Class-E/F Family of ZVS Switching Amplifiers," IEEE Transactions on Microwave Theory and Techniques, vol. 51, No. 6, Jun. 2003, pp. 1677-1690.

* cited by examiner

*Primary Examiner*—Thanh V Pham
*Assistant Examiner*—Caleb Henry
(74) *Attorney, Agent, or Firm*—John W. LaBatt; Hoffman Warnick LLC

(57) ABSTRACT

A field effect transistor that can be operated as a low voltage Class $F_N$ radio frequency (RF) amplifier with harmonic tuning is provided. The field effect transistor includes a common electrode, a gate, and multiple separate electrodes. The common electrode can comprise a source or drain, while the separate electrodes can comprise drains or sources, respectively. The gate can be profiled in a manner that forms multiple gate sections, each having a unique gate length within the gate sections. Each separate electrode can correspond to one of the plurality of gate sections. When operated as a Class $F_N$ RF amplifier with a linear harmonic input, the output signal will comprise a non-linear square wave with sharp fronts and relatively flat peak states.

20 Claims, 5 Drawing Sheets

PROFILED GATE FIELD EFFECT TRANSISTOR WITH ENHANCED HIGH HARMONIC GAIN

REFERENCE TO PRIOR APPLICATIONS

The current application claims the benefit of co-pending U.S. Provisional Application No. 60/877,175, entitled "Profiled gate transistor structure with enhanced high harmonic gain for GaN-based switching mode RF amplifier", which was filed on 26 Dec. 2006 and U.S. Provisional Application No. 60/877,177, entitled "GaN-based class FN-E switching mode RF amplifier with enhanced performance stability", which was filed on 26 Dec. 2006, both of which are hereby incorporated by reference. The application is also related to the co-pending U.S. Utility application Ser. No. 11/746,093, entitled "Two-stage amplification using intermediate non-linear square wave", which was filed on 9 May 2007, and which is hereby incorporated by reference.

FIELD OF THE DISCLOSURE

Aspects of the invention relate generally to field effect transistors, and more particularly, to a field effect transistor that can be utilized as, for example, a non-linear active element for a high power, high efficiency switching mode radio frequency (RF) amplifier circuit.

BACKGROUND OF THE DISCLOSURE

In general, when compared to other semiconductor devices, Gallium Nitride (GaN)-based high electron mobility transistors (HEMTs) can produce superior RF power densities. The superior performance is due to a high breakdown voltage, low channel resistance, high carrier density, as well as high saturation velocities and a lateral layout allowing for a short gate design. Additionally, the ability of GaN-based HEMTs to operate at high ambient temperatures makes them attractive for many practical applications.

Currently, use of GaN-based Heterostructure Field Effect Transistors (HFETs), such as metal-oxide-semiconductor HFETs (MOSHFETs), metal-insulator-semiconductor HFETs (MISHFETs), and modifications thereof, as RF power amplifiers is limited by the operating stability and self-heating effects of the HFETs. In particular, the operating stability of a state-of-the-art GaN-based HFET is very sensitive to the operating conditions, such as a maximum drain bias, instant peak and average gate voltages, and self-heating effects. In order to minimize the self-heating effects, as well as for energy conservation, it is important to achieve high efficiency operation of the HFET.

However, traditional approaches of enhancing the operating efficiency require specific operating conditions that reduce the stable operation time of the HFET. In particular, the stable operation time for the HFET can drop from thousands of hours to minutes or seconds, even just a few RF cycles.

BRIEF SUMMARY OF THE DISCLOSURE

Aspects of the invention provide a field effect transistor that can be operated as a low voltage Class $F_N$ radio frequency (RF) amplifier with harmonic tuning. The field effect transistor includes a common electrode, a gate, and multiple separate electrodes. The common electrode can comprise a source or drain, while the separate electrodes can comprise drains or sources, respectively. The gate can be profiled in a manner that forms multiple gate sections, each having a unique gate length within the gate sections. Each separate electrode can correspond to one of the plurality of gate sections. When operated as a Class $F_N$ RF amplifier with a linear harmonic input, the output signal will comprise a non-linear square wave with sharp fronts and relatively flat peak states.

A first aspect of the invention provides a field effect transistor comprising: a common electrode; a gate having a plurality of gate sections, each section comprising a unique gate length within the plurality of gate sections; and a plurality of separate electrodes, each separate electrode corresponding to one of the plurality of gate sections.

A second aspect of the invention provides a field effect transistor comprising: a common source electrode; a gate having a plurality of gate sections, each section comprising a unique gate length within the plurality of gate sections; a plurality of separate drain electrodes, each separate drain electrode corresponding to one of the plurality of gate sections; and a resonator electrically connected between a first separate drain electrode and a second separate drain electrode.

A third aspect of the invention provides a circuit comprising: a field effect transistor including: a common electrode; a gate having a plurality of gate sections, each section comprising a unique gate length within the plurality of gate sections; and a plurality of separate electrodes, each separate electrode corresponding to one of the plurality of gate sections.

Additional aspects of the invention provide methods and systems of manufacturing the field effect transistors and/or circuits described herein using any solution.

The illustrative aspects of the invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, aspects of the invention provide a field effect transistor that can be operated as a low voltage Class $F_N$ radio frequency (RF) amplifier with harmonic tuning. The field effect transistor includes a common electrode, a gate, and multiple separate electrodes. The common electrode can comprise a source or drain, while the separate electrodes can comprise drains or sources, respectively. The gate can be profiled in a manner that forms multiple gate sections, each having a unique gate length within the gate sections. Each separate electrode can correspond to one of the plurality of gate sections. When operated as a Class $F_N$ RF amplifier with a linear harmonic input, the output signal will comprise a non-linear square wave with sharp fronts and relatively flat peak states. As used herein, unless otherwise noted, the term "set" means one or more (i.e., at least one) and the phrase "any solution" means any now known or later developed solution.

Figure 1:
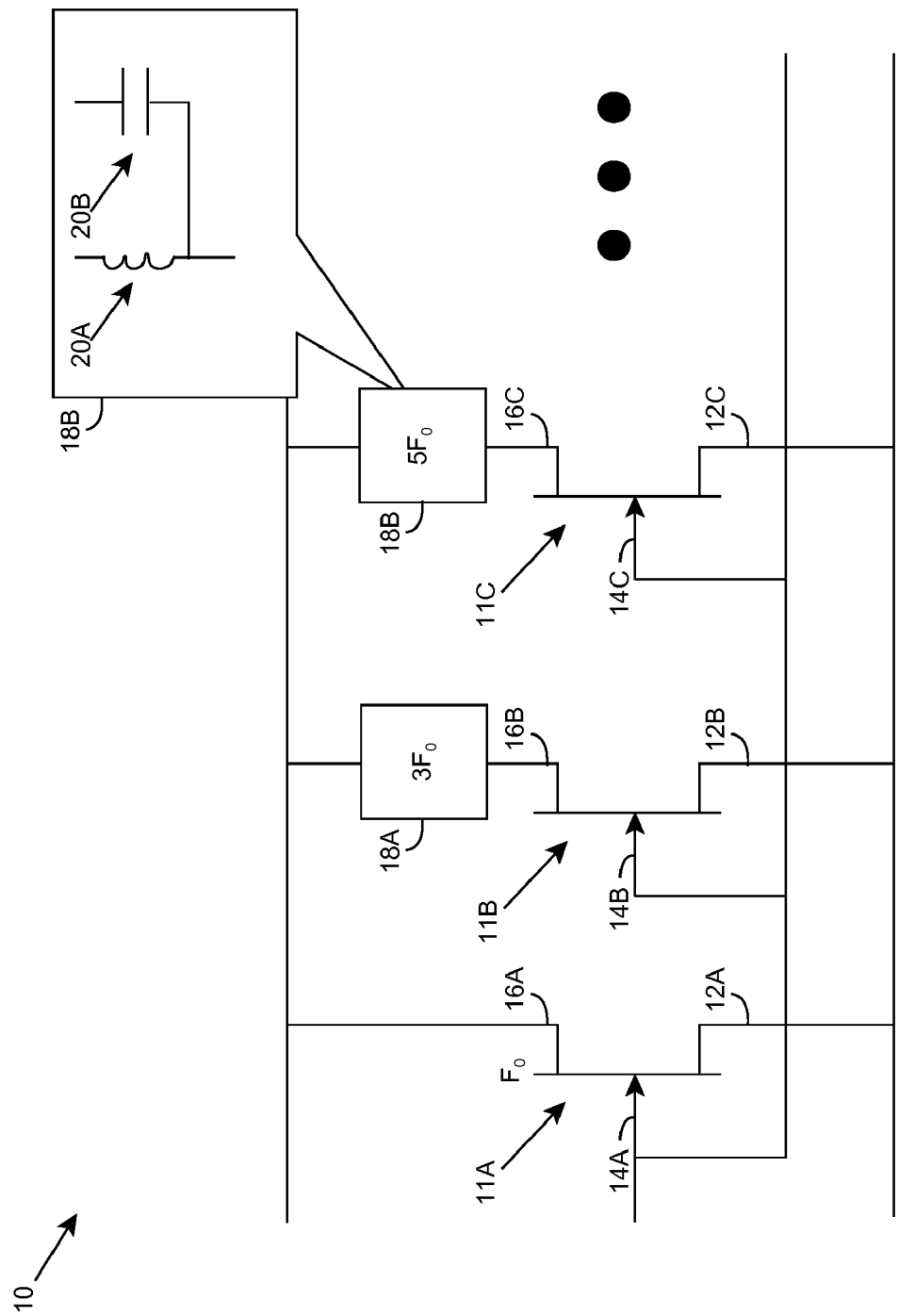
FIG. 1 shows a block diagram of an illustrative circuit according to an embodiment.

Turning to the drawings, FIG. 1 shows a block diagram of an illustrative circuit 10 according to an embodiment. As illustrated, circuit 10 includes a plurality of field effect transistors (FETs) 11A-C. FETs 11A-C comprise first electrodes 12A-C (e.g., source electrodes) that are electrically connected to one another and gates 14A-C that are electrically connected to one another. Further, FETs 11A-C comprise second electrodes 16A-C (e.g., drain electrodes). Each second electrode 16B-C is electrically connected to second electrode 16A via a resonator 18A-B. As illustrated, a resonator 18A-B, such as resonator 18B, can comprise an inductor 20A and capacitor 20B circuit (i.e., an LC resonator). However, it is understood that resonators 18A-B can be implemented using any solution.

Circuit 10 can be operated as a low voltage Class $F_N$ radio frequency (RF) amplifier with harmonic tuning, where N comprises a number of supported harmonics. In particular, each FET 11A-C can correspond to a particular odd harmonic and each resonator 18A-B can be tuned to the corresponding odd harmonic. To this extent, FET 11A corresponds to the first harmonic ($F_0$), FET 11B and resonator 18A correspond to the third harmonic ($3F_0$), and FET 11C and resonator 18B correspond to the fifth harmonic ($5F_0$). During normal operation in Class F, when an input harmonic signal is applied to sources 12A-C, circuit 10 will form a nearly rectangular meander-type output signal having the same frequency as the input harmonic signal at sources 12A-C.

Figure 2:
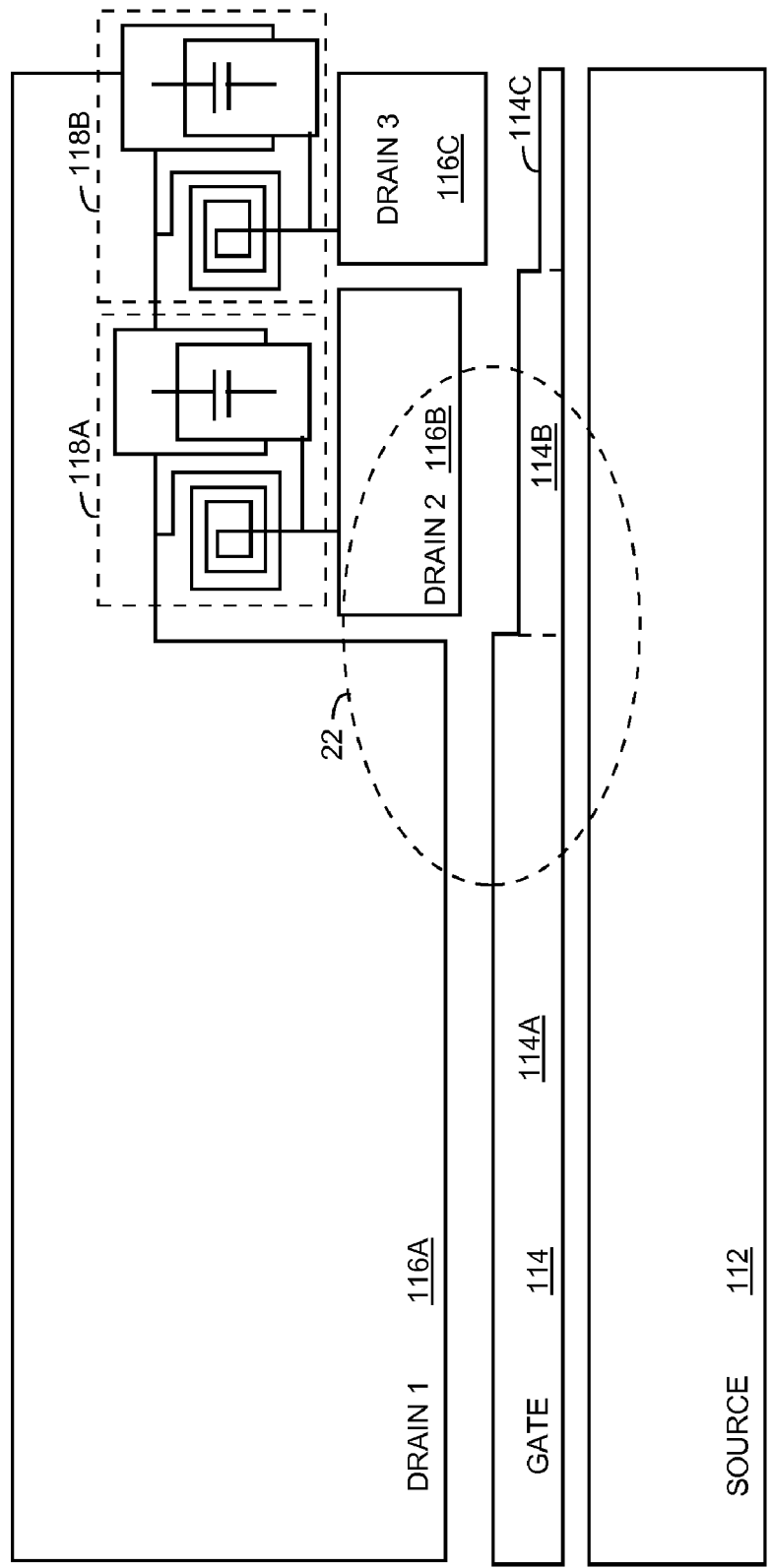
FIG. 2 shows an illustrative monolithic integration of the circuit of FIG. 1 as a single FET according to an embodiment.

FIG. 2 shows an illustrative monolithic integration of circuit 10 (FIG. 1) as a single FET 110 according to an embodiment. Referring to FIGS. 1 and 2, since first electrodes 12A-C and gates 14A-C of FETs 11A-C are respectively electrically connected to one another, circuit 10 can be implemented as a single FET 110. In particular, FET 110 can have a common first electrode 112 (e.g., a source electrode), a common gate 114, and a plurality of separate second electrodes 116A-C (e.g., drain electrodes) with LC resonators 118A-B electrically connected between a first separate second electrode, e.g., electrode 116A, and every other separate second electrode 116B-C. LC resonators 118A-B can be connected either externally or using monolithic integration using any solution.

Gate 114 is profiled, thereby forming a plurality of gate sections 114A-C. Each gate section 114A-C has a corresponding unique gate length as measured along a direction of current flow (vertical height in FIG. 2) within the plurality of gate sections 114A-C. Further, each gate section 114A-C corresponds to a unique one of the plurality of separate second electrodes 116A-C, each of which opposes the corresponding gate section 114A-C. Each gate section 114A-C and separate electrode 116A-C pair corresponds to a unique supported harmonic. A width (horizontal width in FIG. 2) of each separate electrode 116A-C can be selected to provide a desired amplitude of amplification of the corresponding unique harmonic using any solution. Additionally, a gate length of each gate section 114A-C can be selected so that the current gain at each harmonic is substantially similar. Further, a gate-to-drain separation can be varied for each gate section 114A-C and separate electrode 116A-C pair to accomplish a higher gain for additional harmonics used in a feedback loop using any solution.

In general, a length of each gate is inversely proportional to the corresponding signal frequency. To this extent, gate section 114B can have a gate length that is one-third of the gate length of gate section 114A, gate section 114C can have a gate length that is one-fifth of the gate length of gate section 114A, etc. Similarly, an amount of power (total power level) supported by FET 110 scales with a width of each separate (e.g., drain) electrode 116A-C. To this extent, a size of each separate electrode 116A-C (e.g., device periphery) can be scaled based on a desired total power level using any solution. In this case, resonators 118A-B may also need to be adjusted to accommodate a change in resistance due to the larger/smaller sizes of separate electrodes 116A-C using any solution. Regardless, it is understood that these design considerations are only illustrative, and other design considerations for FET 110 are possible under aspects of the invention.

In an embodiment, FET 110 comprises a Heterostructure Field Effect Transistor (HFET). FET 110 can comprise any type of HFET including, but not limited to, a Schottky HFET, a metal-oxide-semiconductor HFET (MOSHFET), metal-insulator-semiconductor HFET (MISHFET), an insulated gate HFET (IG-HFET), a double heterojunction FET (DHFET), a metal-oxide-semiconductor DHFET (MOSDHFET), a metal-insulator-semiconductor DHFET (MISDHFET), and/or the like (e.g., other HFETs with similar stability diagrams). Further, in an embodiment, FET 110 is constructed using group-III nitride-based material(s), such as binary, ternary, and/or quaternary material(s) selected from $Al_xGa_yIn_zN$, where $0 \leq X, Y, Z \leq 1$, and $X+Y+Z=1$. Additionally, FET 110 can include any type of gate insulating material to provide gate insulation. For example, for a MISHFET or a MISDHFET, the gate insulating material can be silicon nitride, aluminum oxide, and/or other dielectrics or compound dielectric structures having a high dielectric constant (high-k). Similarly, for a MOSHFET or a MOSDHFET, the gate insulating material can be silicon oxide, silicon oxynitride, and/or other dielectrics or compound dielectric structures.

Figure 3:
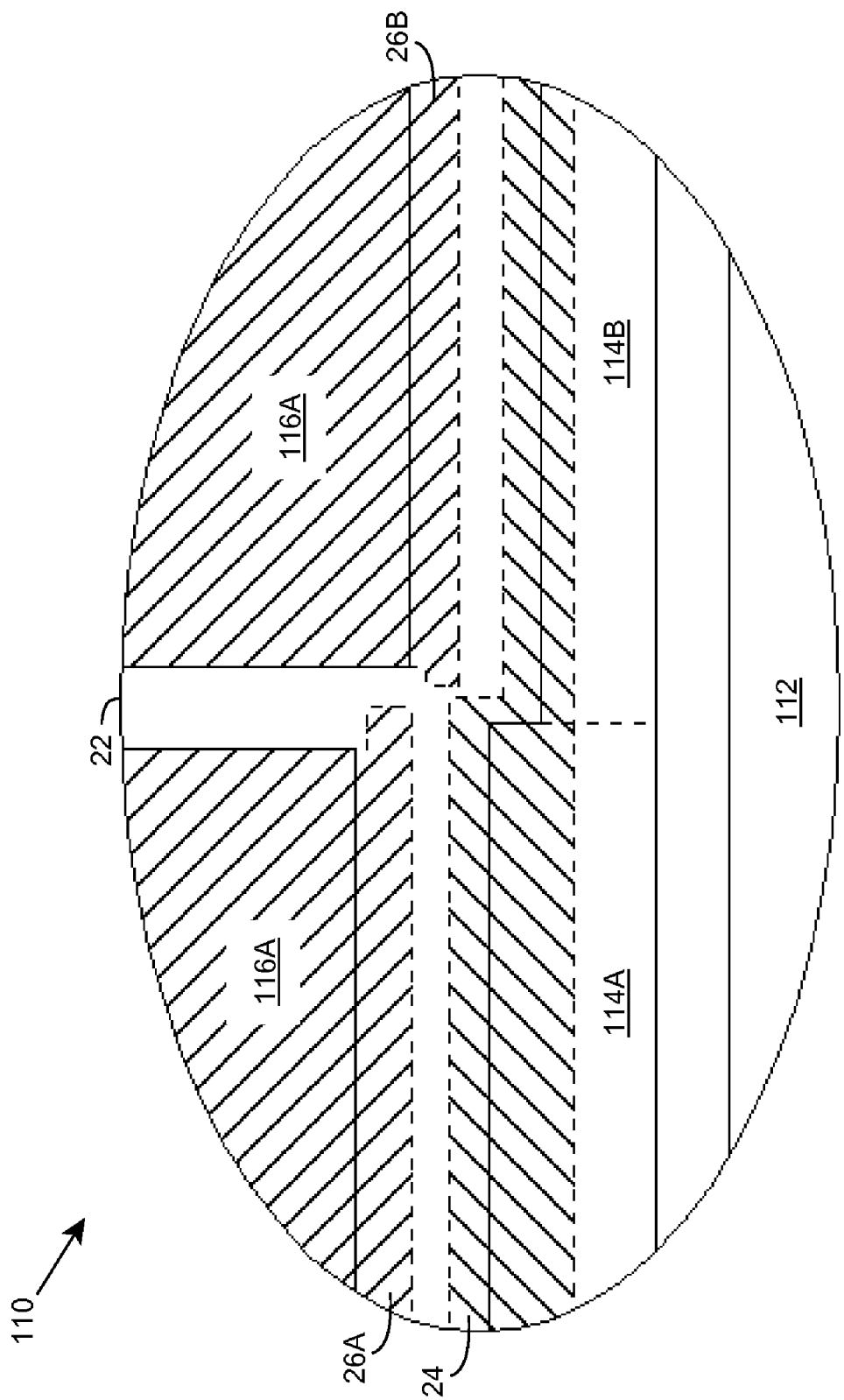
FIG. 3 shows an illustrative configuration of field plates in a portion of the FET of FIG. 2 according to an embodiment.

FET 110 also can include one or more field plates. In this case, a field plate can be electrically connected to gate 114 and/or one or more separate electrodes 116A-C using any solution. FIG. 3 shows an illustrative configuration of field plates in a portion 22 of FET 110 according to an embodiment. Gate field plate 24 is shown electrically connected to gate 114 (FIG. 2) and the sections 114A-B thereof. Gate field plate 24 extends beyond an edge of gate 114, and is profiled in the same manner as gate sections 114A-B. It is understood that gate field plate 24 can extend in a similar manner along an entire width (horizontal side in FIG. 2) of gate 114. Additionally, electrode field plates 26A-B are shown electrically connected to separate electrodes 116A-B, respectively. As illustrated, electrode field plates 26A-B can substantially conform to an area of the corresponding separate electrode 116A-B along its length (vertical side), while extending beyond its side that runs adjacent to gate 114. Separate electrode 116C (FIG. 2) also can include an electrode field plate configured in a similar manner. It is understood that field plates 24, 26A-B are only illustrative. To this extent, gate field plate 24 can be implemented without being profiled. Further, FET 110 could be implemented with no field plates, only a gate field plate 24, field plates on one or more separate electrodes, and/or the like.

Returning to FIG. 2, it is understood that FET 110 including three gate sections 114A-C, a corresponding three separate electrodes 116A-C, and a corresponding two resonators 118A-B is only illustrative. In general, FET 110 can include any number of two or more gate sections and separate electrodes, and a corresponding set of resonators. A number of gate section and resonator pairs can be selected based on a desired circuit complexity and/or a desired waveform (e.g., how close to a rectangular signal) of the output signal using any solution. In practice, the number of harmonics is limited by the cut-off frequency of the corresponding gate area. Currently, cut-off frequencies in a range of approximately 60-80 GHz, with values as high as approximately 163 GHz, are possible.

Further, in alternative embodiments, which can be implemented based on different desired operating characteristics, FET 110 may not include resonators 118A-B, may include different types of resonators 118A-B, and/or the like. Still further, an alternative FET may have a common drain electrode, a profiled gate, and separate source electrodes. In this case, each separate source electrode can correspond to a unique section of the profiled gate having a unique gate length, and other design considerations discussed herein with respect to separate drain electrodes will also apply to separate source electrodes.

Figure 4:
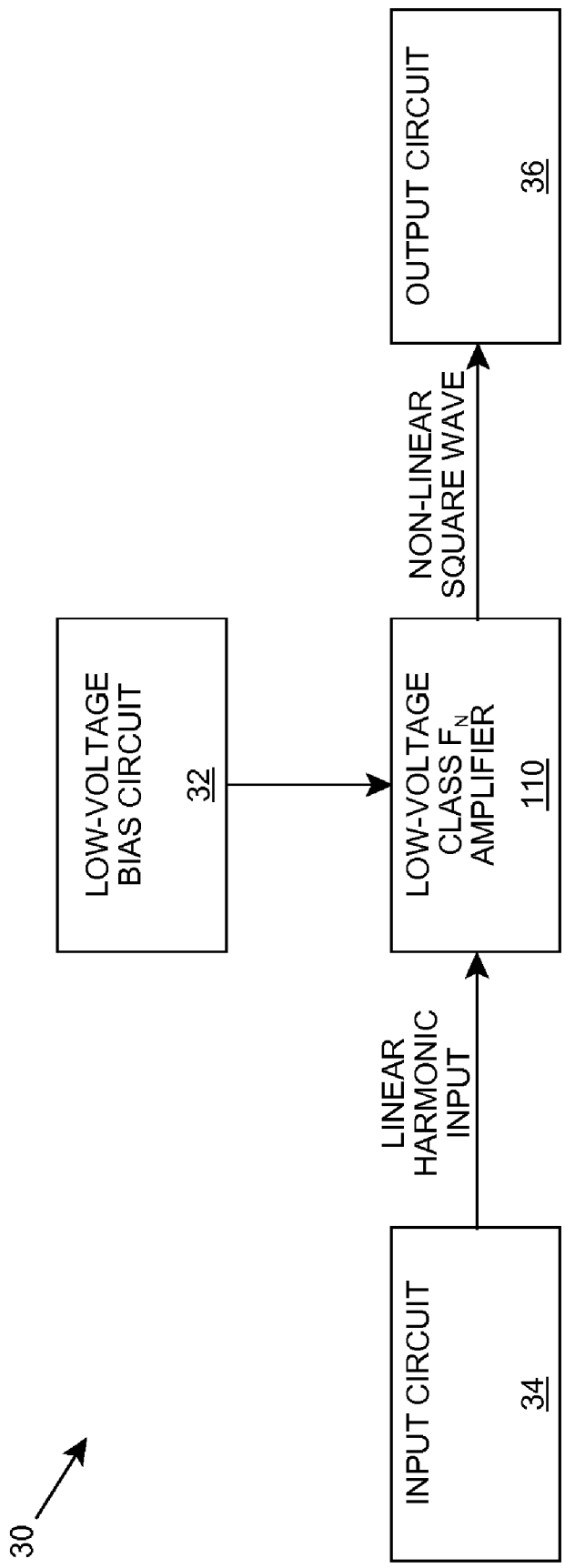
FIG. 4 shows a block diagram of an illustrative circuit for operating the FET of FIG. 2 as a Class $F_N$ RF amplifier according to an embodiment.

In any event, as discussed briefly above with respect to circuit 10 (FIG. 1), FET 110 can be operated as a low voltage Class $F_N$ radio frequency (RF) amplifier with harmonic tuning. In this case, each gate section 114A-C and separate electrode 116A-C pair, with or without a resonator 118A-B, corresponds to a harmonic that is amplified. To this extent, FIG. 4 shows a block diagram of an illustrative circuit 30 for operating FET 110 as a Class $F_N$ RF amplifier according to an embodiment. Referring to FIGS. 2 and 4, during normal operation of FET 110 in Class F, input circuit 34 provides a linear harmonic signal to common electrode 112, and low-voltage bias circuit 32 applies a bias voltage to gate 114. An output circuit 36 (e.g., load) electrically connected to separate contact 116A will receive a non-linear square wave having the same frequency as the input harmonic signal at common electrode 112. When a load is not connected to separate contact 116A, a first-harmonic output signal for locked-phase synchronization can be obtained from separate contact 116A.

Figure 5:
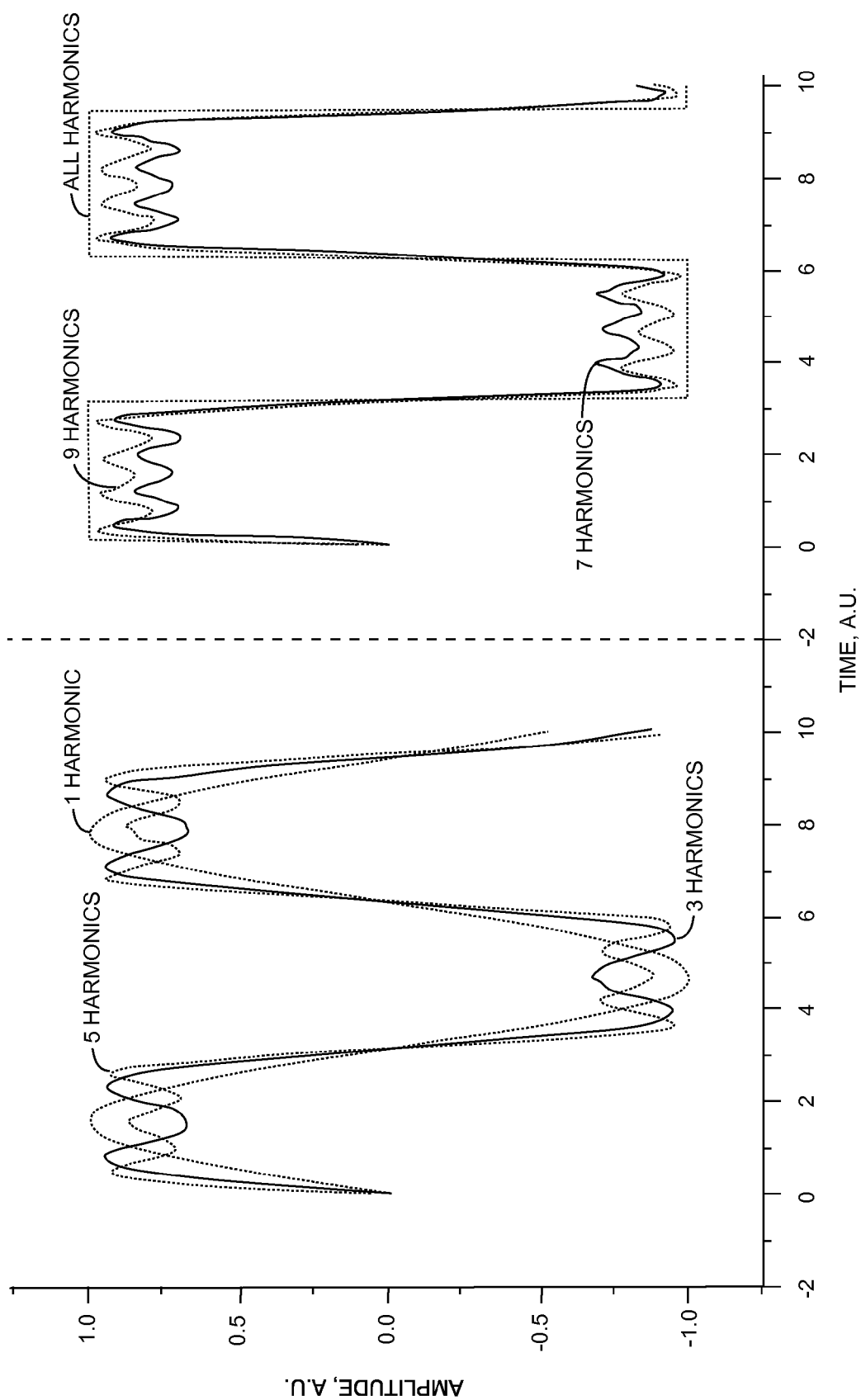
FIG. 5 shows various illustrative output signals, which can be generated by the FET described herein when operated as a Class $F_N$ RF amplifier according to an embodiment.

FIG. 5 shows various illustrative output signals, which can be generated by the FET described herein when operated as a Class $F_N$ RF amplifier according to an embodiment. As illustrated, the non-linear square wave comprises a nearly rectangular meander-type output signal. The amplitude of the output signal is controlled (e.g., a reduced number of negative or positive spikes), with each peak state being relatively flat. Further, the signal comprises sharp fronts between the two peak states. As the number of harmonics supported by FET 110 increases, the non-linear square wave will become increasingly closer to a square wave (indicated by the "all harmonics" signal) with flatter peak states and sharper fronts.

In an embodiment, described in the co-pending U.S. Utility application Ser. No. 11/746,093, entitled "Two-stage amplification using intermediate non-linear square wave", which was filed on 9 May 2007, and which was previously incorporated by reference, output circuit 36 (FIG. 4) comprises a Class E amplifier, for which the output signal of FET 110 is used as an input. In this case, FET 110 and output circuit 36 can operate as a Class $F_N$-E amplifier. As a sharpness of the signal front for the output signal of FET 110 increases, energy loss in the amplifier due to the transient reduces, which enables the amplifier to approach an ideal case of practically bias independent energy loss that is associated only with the on-state heat dissipation. Further, the flatness of the peak will mostly improve the stability of the amplifier by reducing the negative and positive spikes of the input signal. As a result, the number of harmonics in FET 110 can be extended as a trade-off between the efficiency of the Class E amplifier and circuit complexity. Further, the feedback circuit of the Class $F_N$-E amplifier can use the transconductance non-linearity of FET 110 and/or the non-linearity of the output capacitance related to the field plate design (when incorporated in FET 110) as a source(s) of high harmonics.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A field effect transistor comprising:
   a common electrode;
   a single gate having a plurality of gate sections, each section comprising a different gate length within the plurality of gate sections; and
   a plurality of separate electrodes, each separate electrode corresponding to one of the plurality of gate sections.

2. The field effect transistor of claim 1, wherein the common electrode comprises a source electrode and each of the plurality of separate electrodes comprises a drain electrode.

3. The field effect transistor of claim 1, wherein the common electrode comprises a drain electrode and each of the plurality of separate electrodes comprises a source electrode.

4. The field effect transistor of claim 1, further comprising a resonator electrically connected between a first separate electrode and a second separate electrode.

5. The field effect transistor of claim 1, wherein a separation between a first gate section and a corresponding first separate electrode varies from a separation between a second gate section and a corresponding second separate electrode.

6. The field effect transistor of claim 1, further comprising a field plate electrically connected to the gate.

7. The field effect transistor of claim 1, further comprising a field plate electrically connected to one of the plurality of separate electrodes.

8. The field effect transistor of claim 1, wherein the field effect transistor comprises a Heterostructure Field Effect Transistor (HFET).

9. The field effect transistor of claim 8, wherein the HFET is constructed using group-III nitride-based material.

10. A field effect transistor comprising:
    a common source electrode;
    a single gate having a plurality of gate sections, each section comprising a different gate length within the plurality of gate sections;
    a plurality of separate drain electrodes, each separate drain electrode corresponding to one of the plurality of gate sections; and
    a resonator electrically connected between a first separate drain electrode and a second separate drain electrode.

11. The field effect transistor of claim 10, wherein each of the plurality of gate sections and corresponding separate drain electrodes provides amplification of a corresponding unique harmonic of a signal received at the common source electrode.

12. The field effect transistor of claim 11, wherein each of the plurality of gate sections provides a substantially similar current gain at the corresponding unique harmonic.

13. The field effect transistor of claim 10, wherein a width of each corresponding separate drain electrode provides a desired amplitude of amplification of the corresponding unique harmonic.

14. A circuit comprising:
- a field effect transistor including:
  - a common electrode;
  - a single gate having a plurality of gate sections, each section comprising a different gate length within the plurality of gate sections; and
  - a plurality of separate electrodes, each separate electrode corresponding to one of the plurality of gate sections.

15. The circuit of claim 14, the field effect transistor further including a resonator electrically connected between a first separate electrode and a second separate electrode.

16. The circuit of claim 14, the field effect transistor further including a field plate electrically connected to the gate.

17. The circuit of claim 14, the field effect transistor further including a field plate electrically connected to one of the plurality of separate electrodes.

18. The circuit of claim 14, further comprising a voltage bias circuit for applying a voltage bias to the gate.

19. The circuit of claim 14, further comprising an input circuit for providing a harmonic input to the common electrode.

20. The circuit of claim 19, further comprising an output circuit for receiving a non-linear square wave generated by the field effect transistor.

* * * * *